(12) United States Patent
Lung et al.

(10) Patent No.: US 6,984,548 B2
(45) Date of Patent: Jan. 10, 2006

(54) METHOD OF MAKING A NONVOLATILE MEMORY PROGRAMMABLE BY A HEAT INDUCED CHEMICAL REACTION

(75) Inventors: Hsiang-Lan Lung, Hsinchu (TW); Rui-Chen Liu, Jubei (TW)

(73) Assignee: Macronix International Co., Ltd., Hsinchu (TW)

( * ) Notice: Subject to any disclaimer, the term of this patent is extended or adjusted under 35 U.S.C. 154(b) by 22 days.

(21) Appl. No.: 11/033,895

(22) Filed: Jan. 13, 2005

(65) Prior Publication Data

US 2005/0122781 A1    Jun. 9, 2005

Related U.S. Application Data

(62) Division of application No. 10/456,555, filed on Jun. 9, 2003, now Pat. No. 6,873,541.

(51) Int. Cl.
   *H01L 21/82* (2006.01)
(52) U.S. Cl. .................. 438/131; 438/129; 438/128; 438/467; 438/470; 438/466; 365/163; 365/148
(58) Field of Classification Search ............... 438/129, 438/131, 132, 128, 467, 469, 470, 466; 365/148, 365/163, 225.7
See application file for complete search history.

(56) References Cited

U.S. PATENT DOCUMENTS

| | | | |
|---|---|---|---|
| 3,271,591 A * | 9/1966 | Ovshinsky ................. 327/500 |
| 5,789,758 A * | 8/1998 | Reinberg ...................... 257/3 |
| 6,077,729 A * | 6/2000 | Harshfield ................. 438/128 |
| 6,153,890 A * | 11/2000 | Wolstenholme et al. ....... 257/3 |
| 6,579,760 B1 * | 6/2003 | Lung ......................... 438/257 |
| 6,687,156 B2 * | 2/2004 | Kobayashi et al. .... 365/185.05 |
| 6,797,566 B1 * | 9/2004 | Kobayashi et al. ......... 438/266 |
| 2002/0066921 A1 * | 6/2002 | Sitaram et al. ............ 257/310 |
| 2002/0191458 A1 * | 12/2002 | Kobayashi et al. ........ 365/200 |

* cited by examiner

*Primary Examiner*—Andrew Q. Tran
(74) *Attorney, Agent, or Firm*—Rabin & Berdo, P.C.

(57) ABSTRACT

A nonvolatile memory cell occupying a minimum chip area is provided with a cell structure that includes two or more base materials being programmable by a heat induced chemical reaction to form a layer or layers of alloy. The formation of alloy results in a change in resistance of the cell structure so that one or more programmed states are determined. A semiconductor memory constructed by a large number of the nonvolatile memory cells can be obtained in a compact manner with simple and as few as possible steps. This process vertically stacked layers, and this semiconductor memory is thus easily to be combined with other integrated circuits on a single chip.

12 Claims, 19 Drawing Sheets

METHOD OF MAKING A NONVOLATILE MEMORY PROGRAMMABLE BY A HEAT INDUCED CHEMICAL REACTION

CROSS-REFERENCE TO RELATED APPLICATION

This application is a divisional of application Ser. No. 10/456,555, filed Jun. 9, 2003 now U.S. Pat. No. 6,873,541.

FIELD OF THE INVENTION

The present invention generally relates to an electrically programmable nonvolatile memory, and more particularly to a nonvolatile memory with vertically stacked structure being programmable resulted from the resistance change thereof. This memory is compact and especially advantageous to multilevel and field programmable applications.

BACKGROUND OF THE INVENTION

Field programmable memories are much more flexible in applications than mask ROMs due to their user programmable capabilities. However, field programmable memories are of generally lower density and of higher cost than mask ROMs for the circuitry to support their write/erase functions, and the more complicated scheme and large area consumption employed in their memory cells. Thus scale down and cost down are more important for the memory cells in a field programmable memory.

One approach to make compact memories is the self-aligned process for the memory cells to reduce the tolerance during the formation of the cell structure. Another is the multilevel programmability of the memory cells to increase the capacity in unit cell structure. Many prior arts are disclosed to obtain high-density nonvolatile memories. For example, U.S. Pat. No. 5,789,758 to Reinberg provides a multilevel chalcogenide memory cell with relatively large area chalcogenide electrodes on both sides of the active region of the chalcogenide memory cell to reduce the current density at the interface area between the top and bottom electrodes and the chalcogenide material so as for the current density and associated heating and electrophoretic effects are minimized. U.S. Pat. No. 6,077,729 to Harshfield improves the method for forming a chalcogenide memory array. Also, U.S. Pat. Nos. 5,970,336 and 6,153,890 to Wolstenholme et al. improve multilevel programmable memory incorporating a chalcogenide element as programmable resistor in the memory cell. However, these prior arts do not provide full self-aligned process and cell structure. U.S. Pat. No. 6,420,215 to Knall et al. uses rail-stacks in a three-dimensional memory array for multilevel programmability. However, this scheme makes the cell structure and the method to manufacture the memory array very complicated. Alternatively, U.S. Pat. Nos. 6,185,122 and 6,034,882 to Johnson et al. have maximum use of self-alignment technique to minimize photolithographic limitations for the programmable nonvolatile memory incorporating a state change element in the memory cell. However, the poly-oxide fuse used in this art for memory segment cannot be adopt for multilevel programmability. Such state or phase change element has been utilized for memory cells in nonvolatile memories for a long time, for example in U.S. Pat. No. 5,687,112 and RE37,259 to Johnson et al. and the U.S. Pat. Application in Ser. No. 10/108,658 filed on Mar. 28, 2002 of the coinventor now U.S. Pat. No. 6,579,760, attached hereto for reference. However, use of the phase change element for example with chalcogenides is hard to implement multilevel programmable nonvolatile memories. It is also hard to implement stable and good controllable memory states for memories. Therefore, there is a need to look for alternative programming mechanism for high density and low cost nonvolatile memories.

SUMMARY OF THE INVENTION

Accordingly, it is an object of the present invention to disclose a novel programming mechanism for nonvolatile memories to achieve most compact multilevel programmable capacity and simple manufacturing method.

In a nonvolatile memory cell, according to the present invention, there are included a storage cell and a selecting element with a barrier therebetween. The storage cell includes two or more base materials capable of being reacted with each other by a heat induced chemical reaction to form a layer or layers of alloy from the base materials to program the memory cell. The alloy formation results in a resistance change of the storage cell to thereby determine one or more programmed states.

A semiconductor memory constructed by a large number of the nonvolatile memory cells can be obtained in a most compact manner by simple and as few as possible steps to process vertically stacked layers, and this semiconductor memory is thus easily to be combined with other integrated circuits on a single chip. A method to manufacture the nonvolatile memory array using self-alignment technique is also provided.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
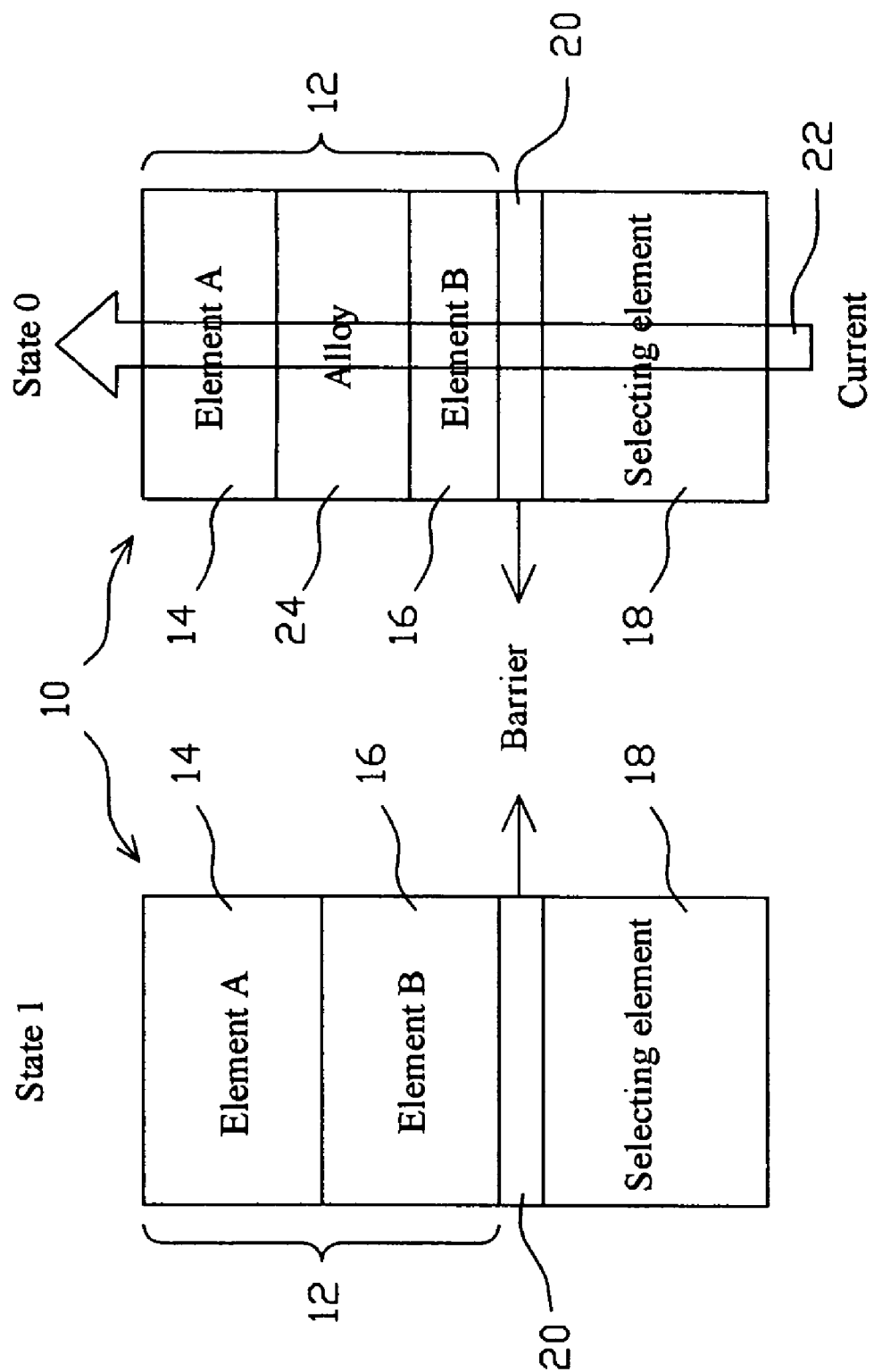
FIG. 1 is an illustrative diagram of an embodiment memory cell to store one bit of data according to the present invention.

A novel programming mechanism is provided herewith for nonvolatile memory, especially advantageous to one-time programming (OTP) memory. To illustrate the basic structure and principle of this disclosed memory, FIG. 1 shows an embodiment structure of a 1-bit memory cell 10 according to the present invention. As is known, a 1-bit memory cell can store one bit data thereof by representing two states corresponding to logic "1" and logic "0", respectively, which are denoted by state 1 and state 0 in FIG. 1. In particular, the memory cell 10 comprises a storage cell 12 that includes two layers of base materials 14 and 16, which are also denoted by element A and element B for their different properties, at its initial or unprogrammed state, i.e., state 1, before the memory cell 10 is programmed. Moreover, a selecting element 18, for example an isolation diode, is provided for the memory cell 10 to prevent it from electrical leakage to outside and to be selected in normal operations. A barrier 20 is further provided between the storage cell 12 and selecting element 18 to prevent the materials either in the storage cell 12 or in the selecting element 18 from outdiffusion to the other or the materials in the storage cell 12 or in the selecting element 18 from reacting with each other. The memory input and output electrodes (not shown in the figure) of the memory cell 10 are coupled to the top surface of the layer 14 and the bottom surface of the selecting element 18, respectively.

When programming the memory cell 10, a programming current 22 is injected into the memory cell 10 by for example applying a voltage drop across the memory cell 10, and by which the base materials 14 and 16 are heated by the programming current 22 flowing therethrough to thereby perform a heat induced chemical reaction between each other, resulting in the formation of an alloy 24 from the elements A and B. Since the elements A and B are reacted with each other to from the alloy 24, the layers 14 and 16 both become thinner during the reaction and, as a result, the resistance of the storage cell 12 is increased or reduced, depending on the respective resistivity of the elements A and B and the alloy 24. In other words, a resistance change is introduced to the memory cell 10 and is thus capable of being used to determine an alternative state, namely, state 0 in FIG. 1. The resistance change resulted from the alloy formation by the heat induced chemical reaction is limited when one or both of the elements A and B are burned off by the chemical reaction. However, it is continuously varied in the programming procedure and may have a much wide range by careful selection of the elements A and B, even though it is used to store digitized states. For the materials suitable for the elements A and B and the alloy formed from them, some examples are taken in Table 1:

TABLE 1

| Element A | Element B | Alloy |
| --- | --- | --- |
| Ni | Si | $Ni_xSi_y$ |
| Co | Si | $Co_xSi_y$ |
| Ti | Si | $Ti_xSi_y$ |
| W | Si | $W_xSi_y$ |
| Ga | As | GaAs |

Figure 2:
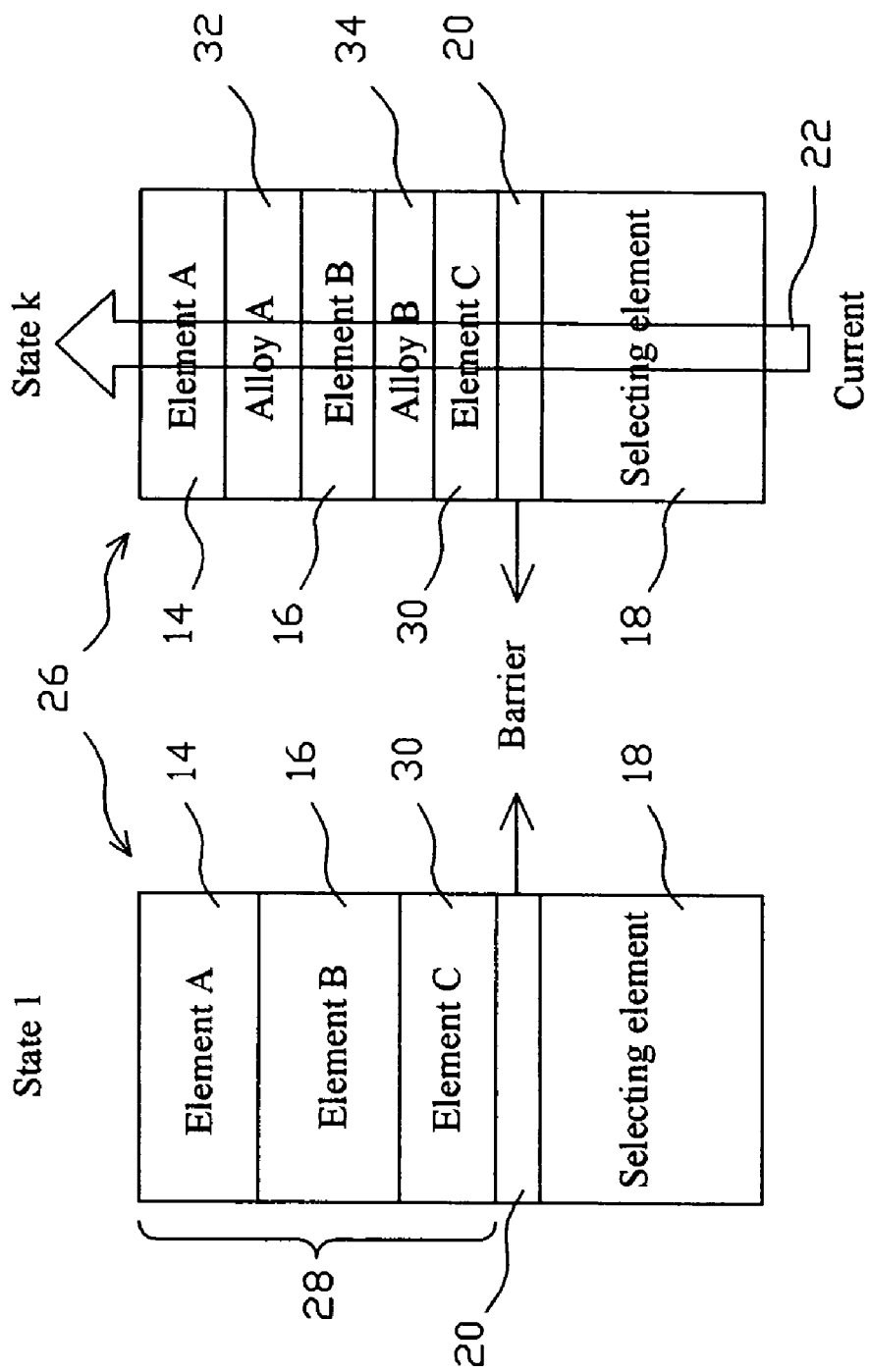
FIG. 2 is an illustrative diagram of an embodiment for a general multilevel programmable memory cell according to the present invention.

A more general structure is described in FIG. 2 with a memory cell 26. Likewise, the memory cell 26 has a storage cell 28, a barrier 20 and a selecting element 18 in stack between a pair of memory input and output electrodes at its initial state, namely, state 1. However, the storage cell 28 includes multilayer of two or more materials that are programmable by heat induced chemical reactions among them. For simplicity, the storage cell 28 in FIG. 2 is shown with three base materials, i.e., elements A, B and C, in three stacked layers 14, 16 and 30, respectively. When heat induced chemical reactions are occurred by forcing a programming current 22 flowing through the storage cell 28, a layer of alloy A 32 is formed by the reaction of the elements A and B at the interface between the layers 14 and 16, and another layer of alloy B 34 is formed by the reaction of the elements B and C at the interface between the layers 16 and 30. As a result, the resistance of the storage cell 28 is determined by the combination of the elements A, B and C and the alloys A and B thereof, or the equivalent of the respective resistances connected in series. Alternatively, chemical reaction of triple materials A, B and C is also possible for one alloy formation if the initial state materials are carefully selected. This manner the resistance change of the storage cell 28 may have a special characteristic curve, depending on the base materials A, B and C selected for the layers 14, 16 and 30.

One method to program the memory cell 26 to a specific state is to apply a constant programming current 22 for a predetermined time period to obtain predetermined thicknesses of the alloys A and B. Another programming method is to apply various levels of programming current 22 for a constant time period for distinguished sates. A further programming method is to apply pulsed programming current 22 with various amplitudes for a constant or various time periods. The mechanism of the formation of the alloys A and B is dominantly determined by the nuclearation of the alloys A and B. Other than the two states system described in FIG. 1, the memory cell 26 may have multilevel programmable capacity. In general, the programmed state k shown in FIG. 2 is one of a set or plurality of programmed states.

Figure 3:
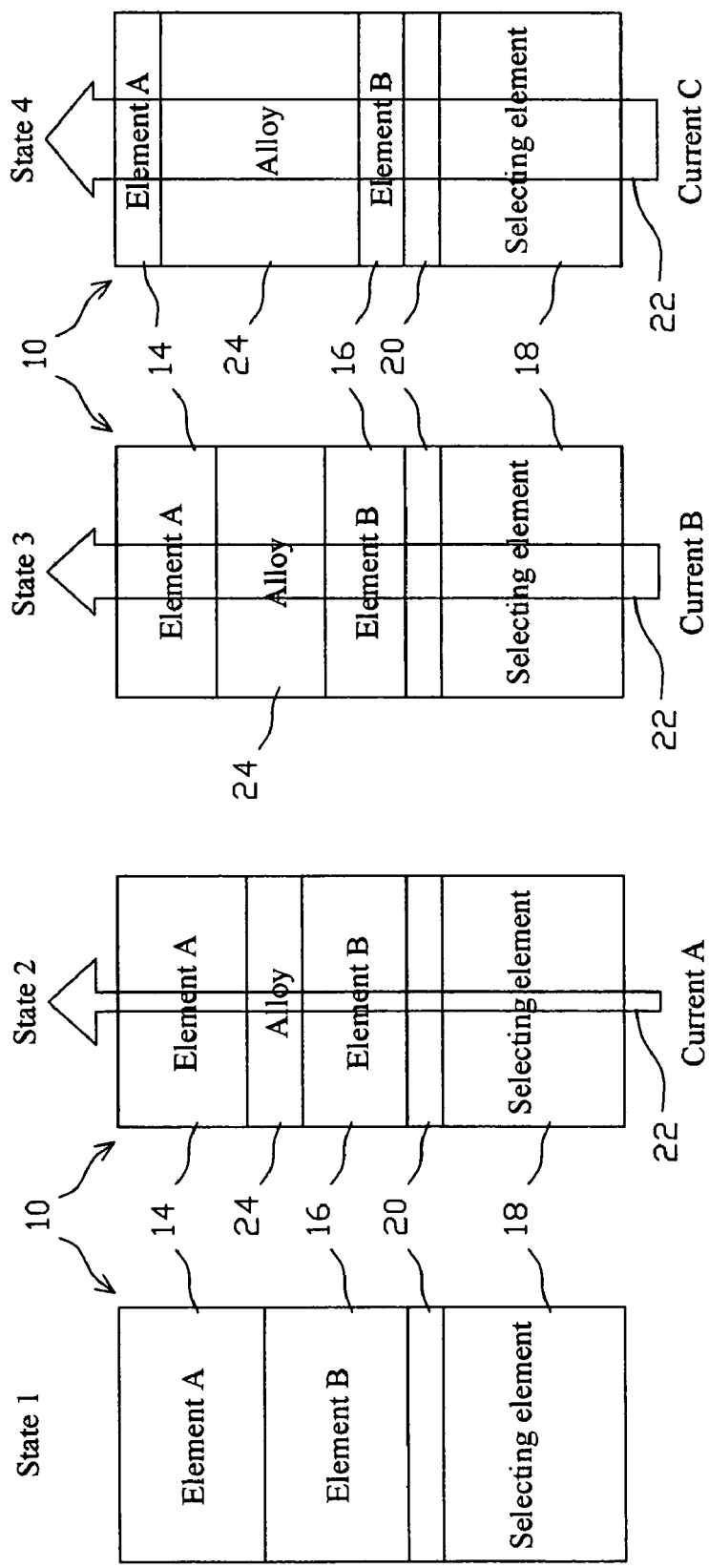
FIG. 3 shows an embodiment for a 4-state memory cell with the same structure as shown in FIG. 1.

Since the thickness of the alloy formed by the heat induced chemical reaction in the storage cell will determine the resistance of the storage cell and thus the state of the memory cell, a specific design of the alloy formation can be achieved to control the thickness of the alloy layer to provide available resolution in resistance for a multilevel programmable system. FIG. 3 shows a 4-state programming system with the same structure as of the memory cell 10 in FIG. 1. At the initial state or state 1, the memory cell 10 has two base materials 14 and 16, a barrier and a selecting element 18 in stack. After a small current A is applied for the programming current 22 to the memory cell 10 for a time duration, the elements A and B are reacted to form a thin layer of alloy 24 to thereby result in state 2. If the programming current 22 is increased to a medium current B to program the memory cell 10 for the same programming time duration, the alloy 24 formed from the elements A and B will have a layer thicker than that at state 2, and thus state 3 is obtained. For state 4, a much larger current C is provided for the programming current 22 to obtain a most thickness of the alloy 24. Preferably, the programming time durations for all programmed states are fixed to a constant, and various levels of the programming current 22 are applied to program the memory cell 10 to various programmed states, in order to maintain a stable control and good performance for the programming of the memory cell 10. However, a constant current for the programming current 22 in combination with short, medium and long time durations to form various thicknesses of the alloy 24 for respective programmed states is also applicable for a multilevel programming system. As in the foregoing description of the embodiment in FIG. 1, the programmable resistance is continuously varied in the programming procedure and may have a much wide range by careful selection of the elements A and B, therefore, there is a tradeoff between the number of programmable states and the resistance resolution to distinguish each adjacent states. The higher resolution the sense circuit for memory read-out of the memory cell 10 has, the more states the memory cell 10 can be programmed.

Figure 4:
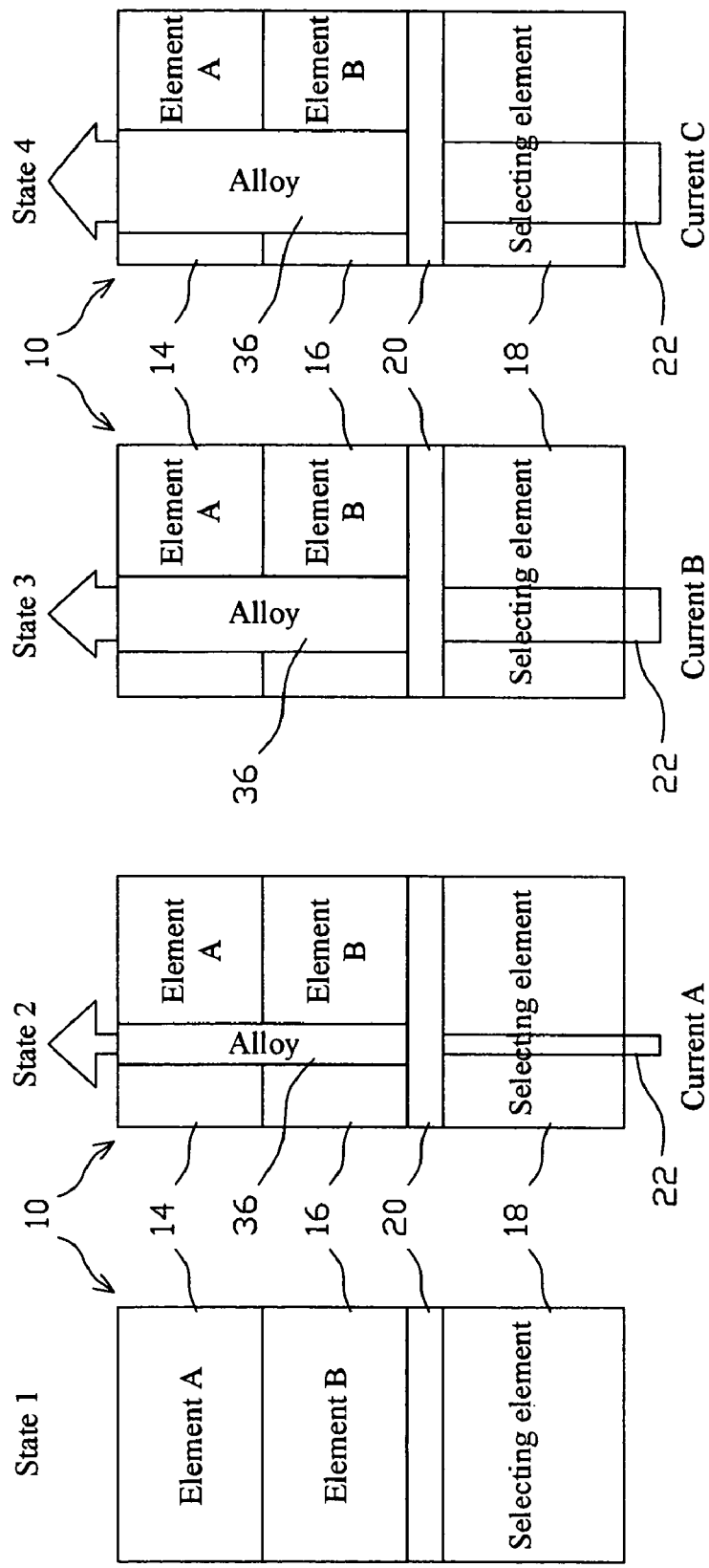
FIG. 4 shows an alternative embodiment for a 4-state memory cell.

Alternative to the thickness control scheme in the foregoing description, FIG. 4 shows a different control scheme and mechanism of the alloy formation to program a memory cell. Again, the structure of the memory cell 10 at the initial state of FIG. 1 is employed herewith for example. However, the alloy 36 in this embodiment is formed by nuclearation on the surface of the barrier 20. In detail, a narrow alloy 36 is formed by applying a small current A for the programming current 22 to the memory cell 10 to program it to state 2 from state 1. Similarly, medium current B and large current C are provided for the programming current 22 to obtain medium wide and most wide alloy 36 corresponding to states 3 and 4, respectively. In this programming system, likewise, the programming time periods for all programmed states, i.e., states 2–4, are fixed to a constant, and various levels of the programming current 22 are employed for various states. Particularly, the alloy 36 for all programmed states is formed nuclearatedly on the surface of the barrier 20 first and then extending therefrom through the layers 14 and 16 to reach the top surface of the element A facing to the memory input electrode. In other words, the programmed states for the memory cell 10 of FIG. 4 are distinguished by controlling the width of the alloy 36 formed from the base materials 14 and 16. This nucleation mechanism can be achieved more easily by a very thin base material 16 or a heated barrier 20 to enhance the nuclearation thereon. By the exemplary description in FIGS. 3 and 4, obviously, the continuously thickness or width control of the alloy formation by heat induced chemical reaction makes it possible of the memory cell 10 to have a good linearity of resistance change, and thus it will have a good controllability and is advantageous to its design of programming current and time duration. By the design of multilevel programmable system in for example FIGS. 3 and 4, the memory capacity can be dramatically increased in the same memory structure, resulting in most high density and compact nonvolatile memories. Moreover, the memory cell 10 has an unidirectionally and nonreversibly programmable property due to the alloy formation of heat induced chemical reaction. For example, once it is programmed to state 2 from its initial state, it can be further programmed to state 3 and state 4 only. A more programmed state can never be reversed or further programmed to a less programmed state.

Figure 5:
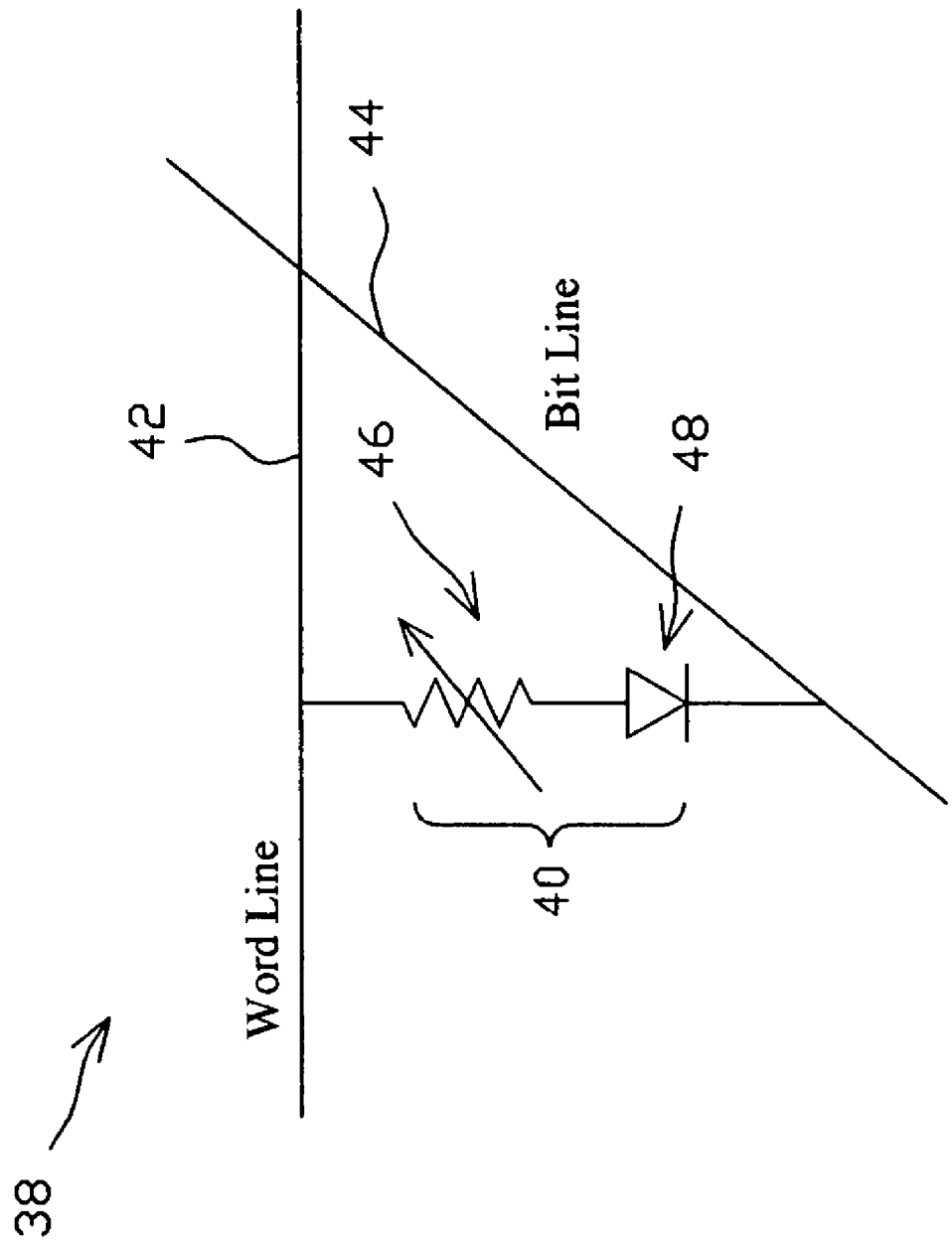
FIG. 5 is the circuit diagram of a memory cell according to the present invention.

The circuit diagram of the invented memory cell is shown in FIG. 5. In this explanatory circuit 38, the memory cell 40 comprises a variable resistor 46 and an isolation diode 48 connected in series between a word line 42 and a bit line 44. The resistance of the variable resistor 46 is programmed to one or more ranges corresponding to various states as by the aforementioned descriptions. The diode 48 is a junction diode, such as PN diode and Schottky diode. In reading operations of the memory cell 40, a voltage drop is applied between the word line 42 and bit line 44, and thus a cell current can be derived or read from the memory cell 40 in various amplitudes to determine the various states or the data stored in the memory cell 40.

Figure 6:
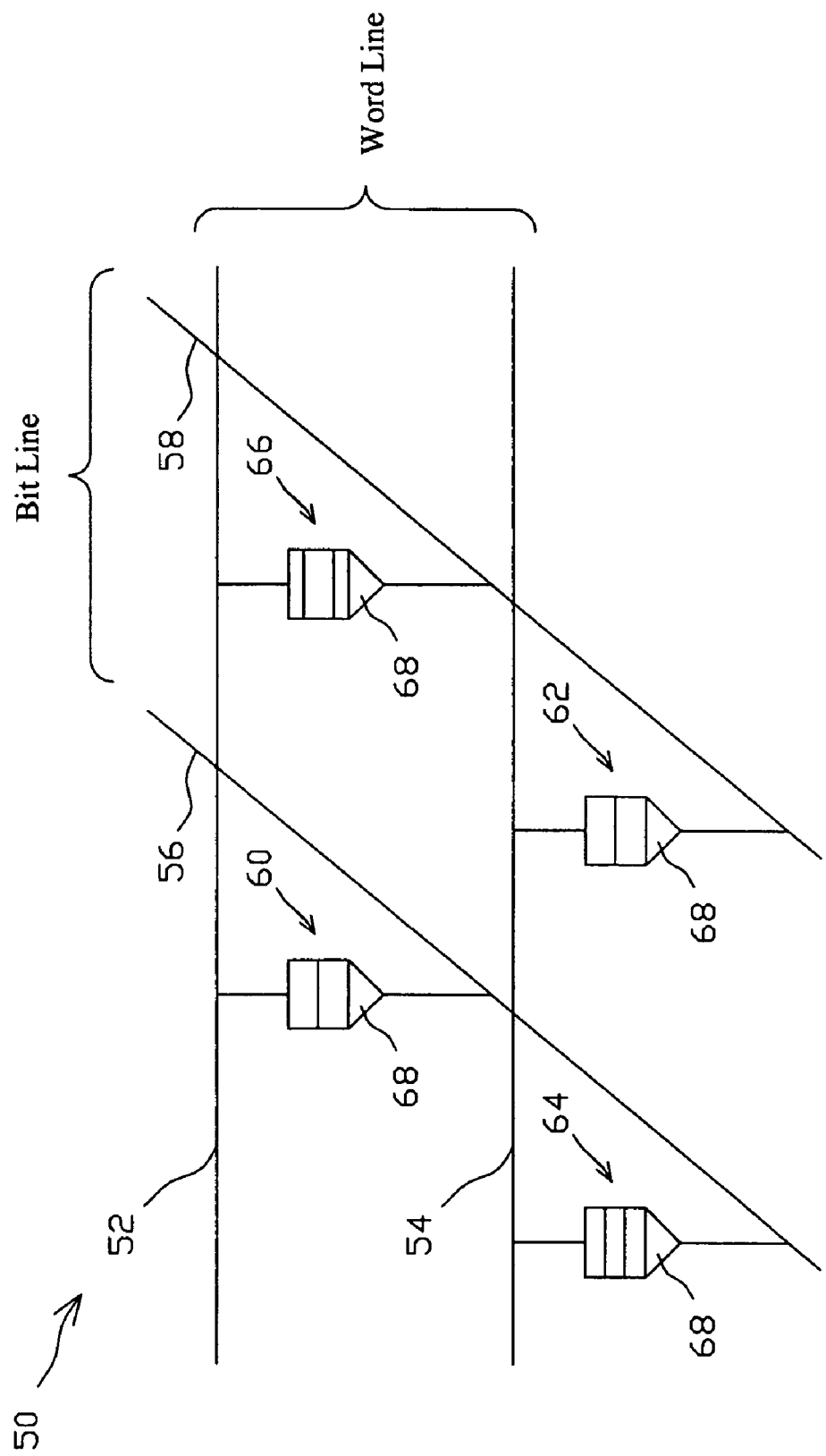
FIG. 6 shows the circuit diagram of a memory array constructed a plurality of the memory cells shown in FIG. 3.

A nonvolatile memory array can be constructed with a large number of the invented memory cells. FIG. 6 shows an illustrative circuit diagram for a memory array 50 whose memory cells each is a multilevel programmable one incorporating the storage cell as shown in FIG. 3. For simplicity, only two word lines 52 and 54 and two bit lines 56 and 58 with each of their intersections to be formed a memory cell are shown in FIG. 6. In this memory array 50, memory cells 60 and 62 are not programmed and thus have their base materials at initial state, memory 64 is programmed to have a thin alloy for a programmed state, and memory 66 is much more programmed to have a thick alloy for another programmed state. As is well known, the word lines 52 and 54 of the memory array 50 are coupled to input circuitry, for example decoder and driver, to select memory cells from the memory array 50, and the bit lines 56 and 58 are coupled to output circuitry, for example sense amplifier, to read the data out from the selected memory cell. Each of the memory cells 60–66 has an isolation diode 68, which prevents the connected memory cell from current leakage when it is not selected or read by the word lines. As depicted in the foregoing embodiments, the memory array 50 is electrically and easily programmed, it can thus implement field programmable nonvolatile memories or user programmable nonvolatile memories. However, since the memory cell has a nonreversible programming property, the memory array 50 is especially applicable for one-time programming nonvolatile memory.

Figure 7:
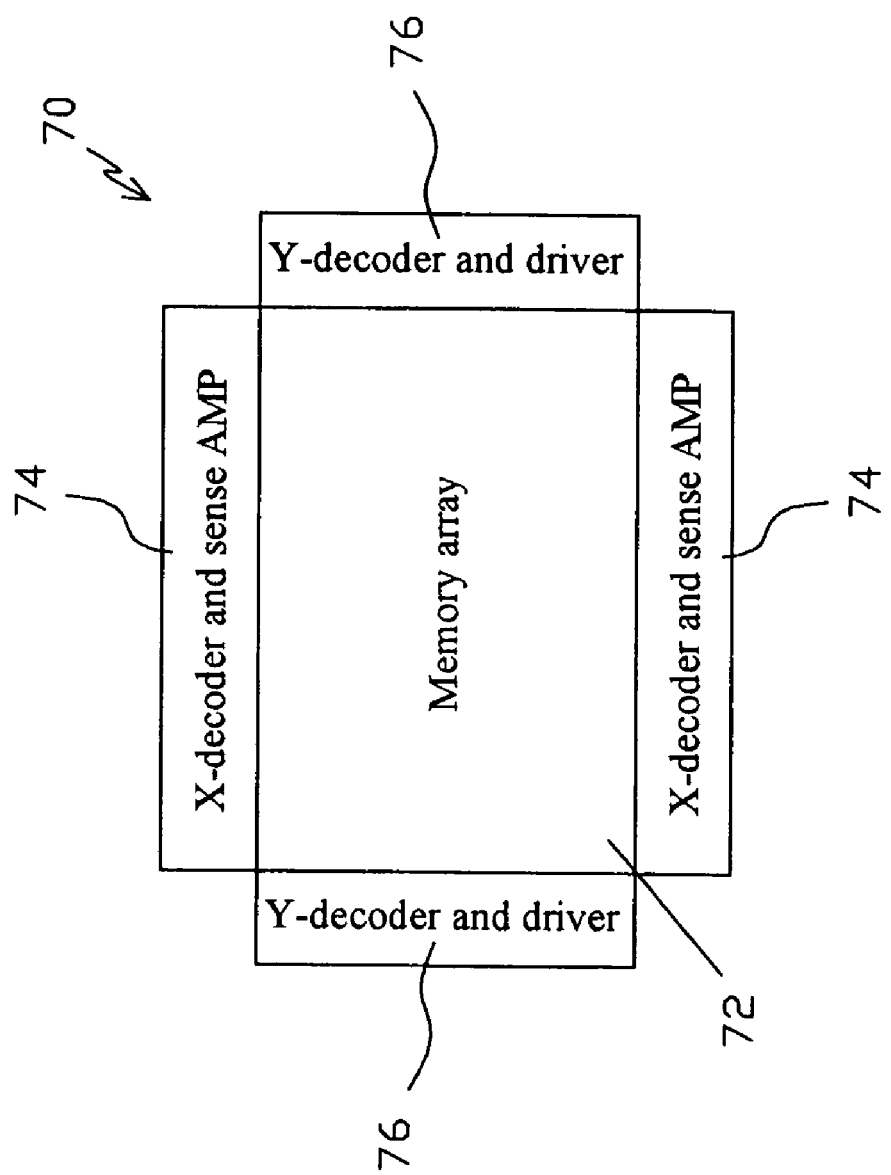
FIG. 7 shows the block diagram of a nonvolatile memory according to the present invention.

Typically, a memory is referred to a memory array in conjunction with its input and output circuitry and/or programming circuitry such as high voltage generator. FIG. 7 shows the block diagram of a nonvolatile memory 70 whose memory array 72 is surrounded by its peripheral circuitry, namely, X-decoder and sense amplifier 74 for the memory output and Y-decoder and driver 76 for the memory input both arranged on the opposite sides of the memory array 72.

Figure 8:
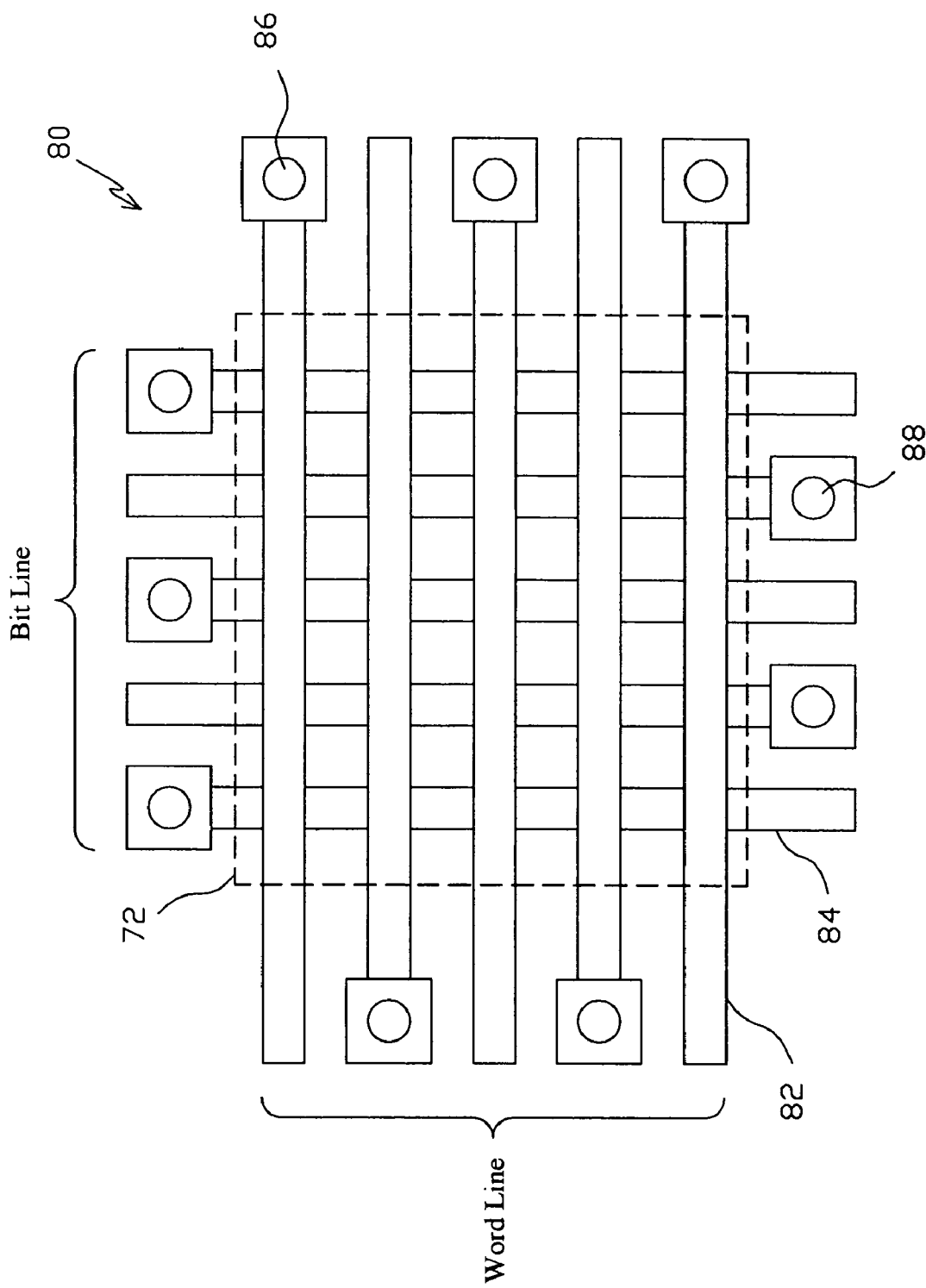
FIG. 8 shows the layout of a nonvolatile memory array according to the present invention.

A layout 80 of a nonvolatile memory array is provided in FIG. 8 to illustrate the memory array 72 incorporating the invented memory cells implemented in an integrated circuit, in which a plurality of word lines 82 are arranged in a direction to cross over a plurality of bit lines 84 in a direction orthogonal to the direction of the word lines 82, so as to form a plurality of intersections each between one of the word lines 82 and one of the bit lines 84. At each intersection of the word lines 82 and bit lines 84, a memory cell as disclosed in the foregoing embodiments is arranged between the respective word line and bit line to have its storage cell coupled to the word line and selecting element coupled to the bit line. The contacts 86 and 88 of the word lines 82 and 84 are positioned outside the memory array 72 and arranged on the opposite sides of the memory array 72 to have a more compact layout.

Figure 9:
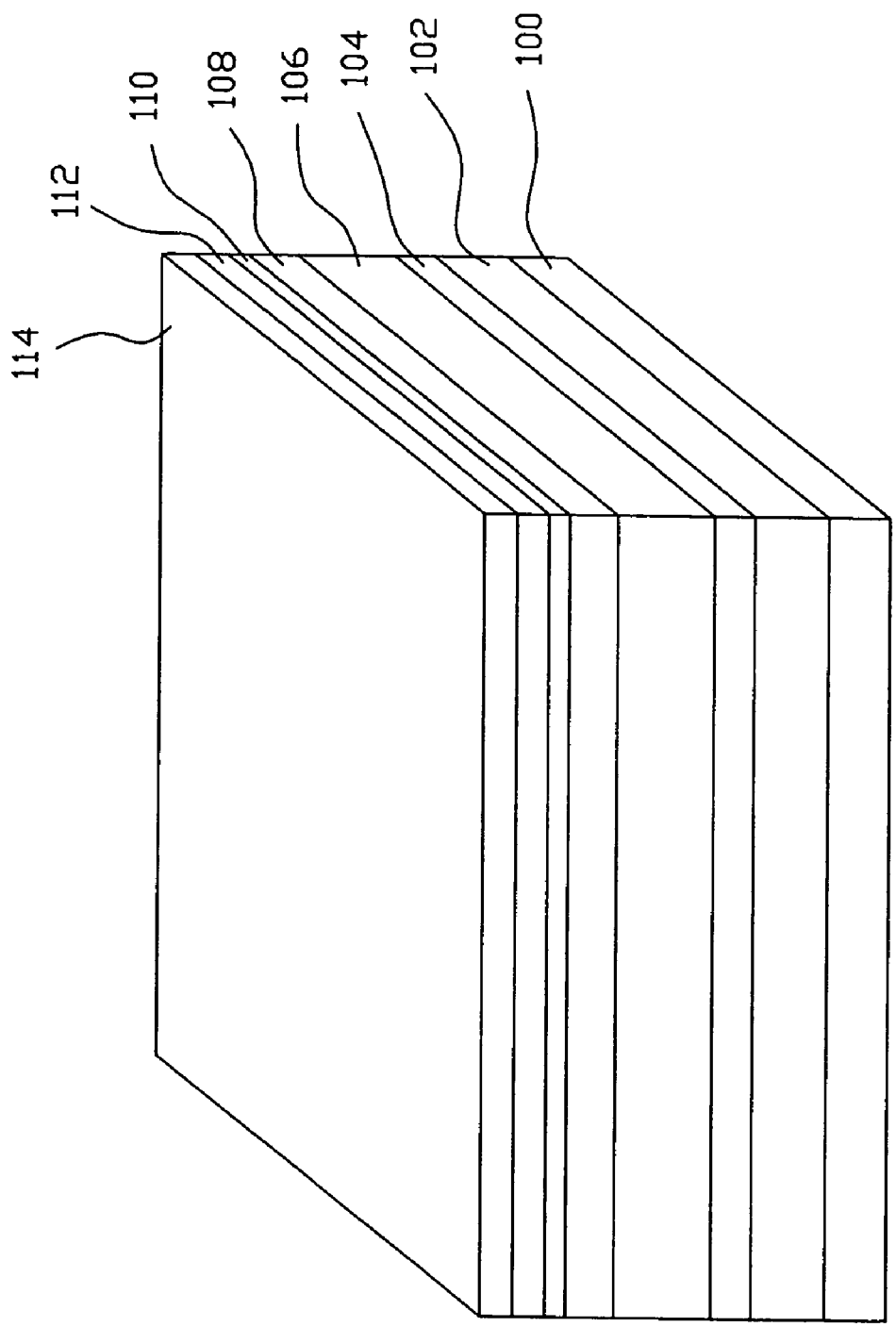
FIG. 9 shows the structure of a multilayer stack formed on a substrate in an embodiment process according to the present invention.

FIGS. 9–16 provide an exemplary process to manufacture the invented nonvolatile memory array. As shown in FIG. 9, a multilayer stack is formed after a substrate 100 is deposited with an insulator 102 by for example an oxide of 500–800 nm by chemical vapor deposition (CVD) on its surface. In the multilayer stack, it is first formed a layer of conductor 104 for example a heavily doped polysilicon or metal with a thickness of 200–400 nm deposited by CVD or sputtering. For example, W, Ta, Pt, TiN, TaN, WSi and alloys thereof are suitable materials for the conductor 104. The layers 106 and 108 above the conductor 104 are selected semiconductor materials to form diodes as the selecting elements for the memory cells. For example, the layer 106 is an N-type polysilicon of 100–600 nm deposited by CVD, plasma enhanced CVD or sputtering and doped by B, Ga, In or other P-type donors, and the layer 108 is a P-type polysilicon of 100–400 nm deposited by CVD, plasma enhanced CVD or sputtering and doped by As or P or N-type donors. The barrier layer 110 is selected from for example TiN, TiAlN, TaN, Ta, Mo or other metals or alloys with a thickness of 200–300 nm deposited by sputtering. Layers 112 and 114 are selected from materials that are stable under normal memory operations but capable of reacted with each other when they are heated to a high temperature, for example those shown in Table 1.

Figure 10:
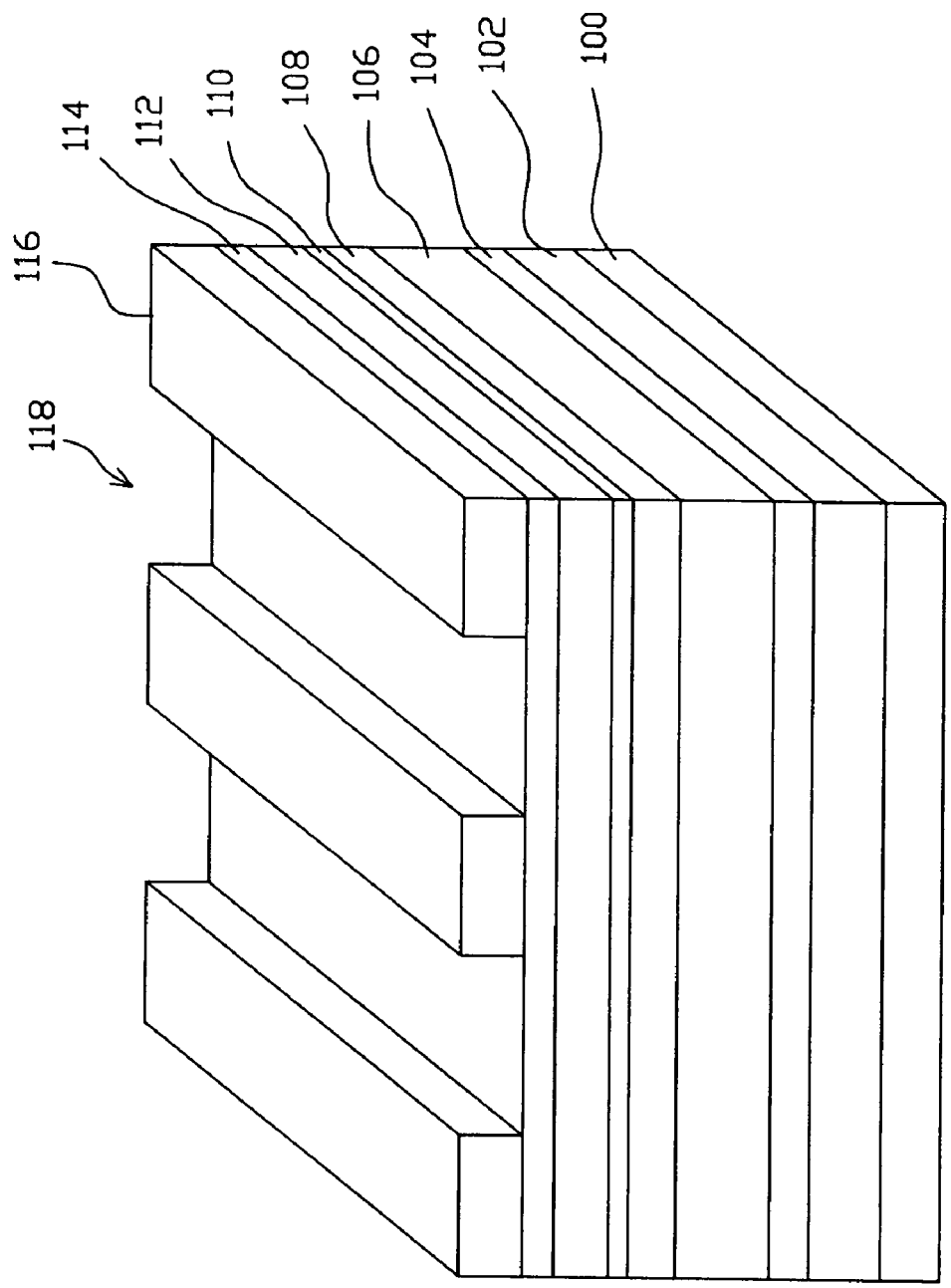
FIG. 10 shows the structure after a photoresist is developed to define bit lines on the multilayer stack of FIG. 9.
Figure 11:
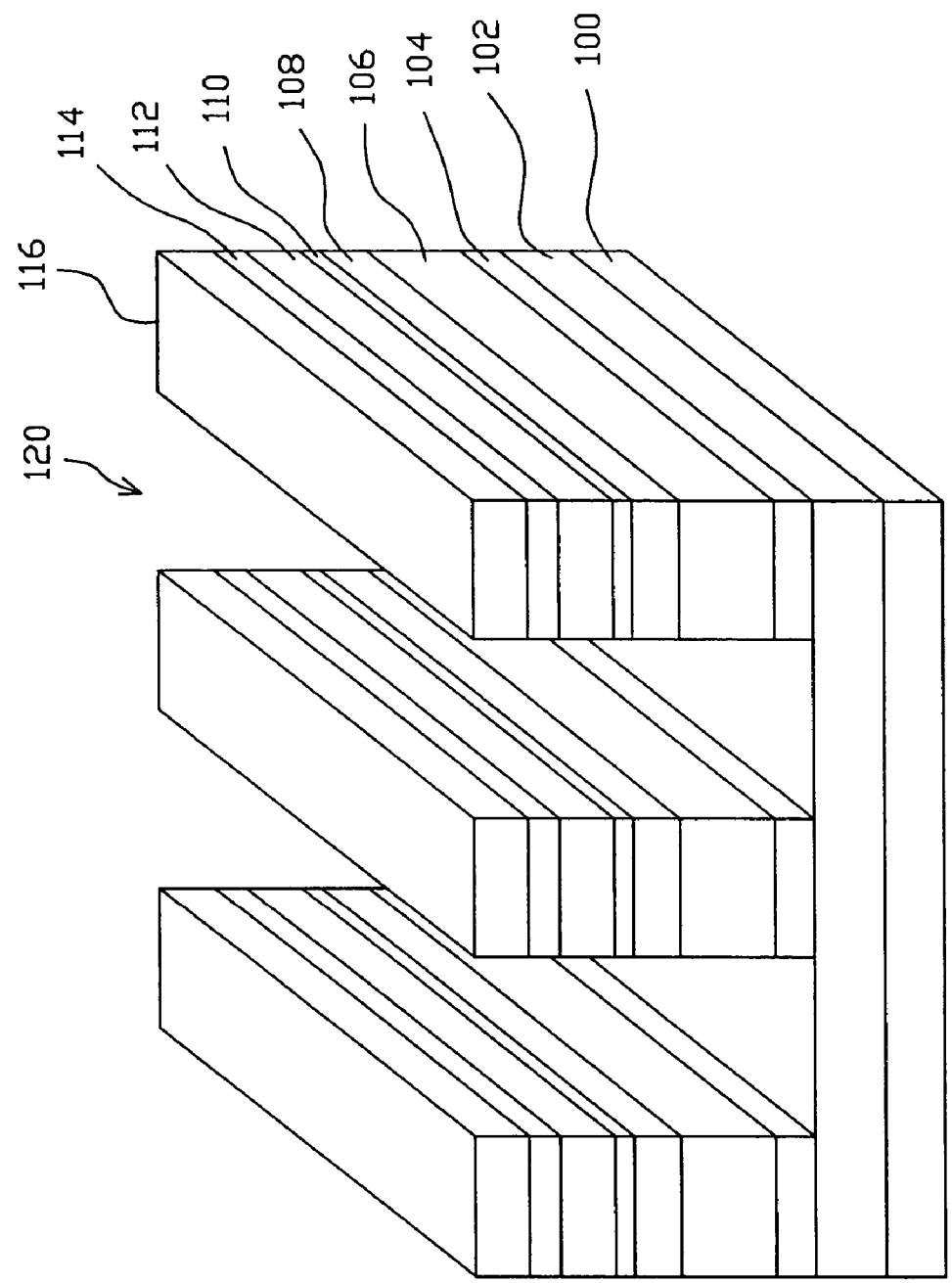
FIG. 11 shows the structure after gaps are etched in the multilayer stack of FIG. 10.
Figure 12:
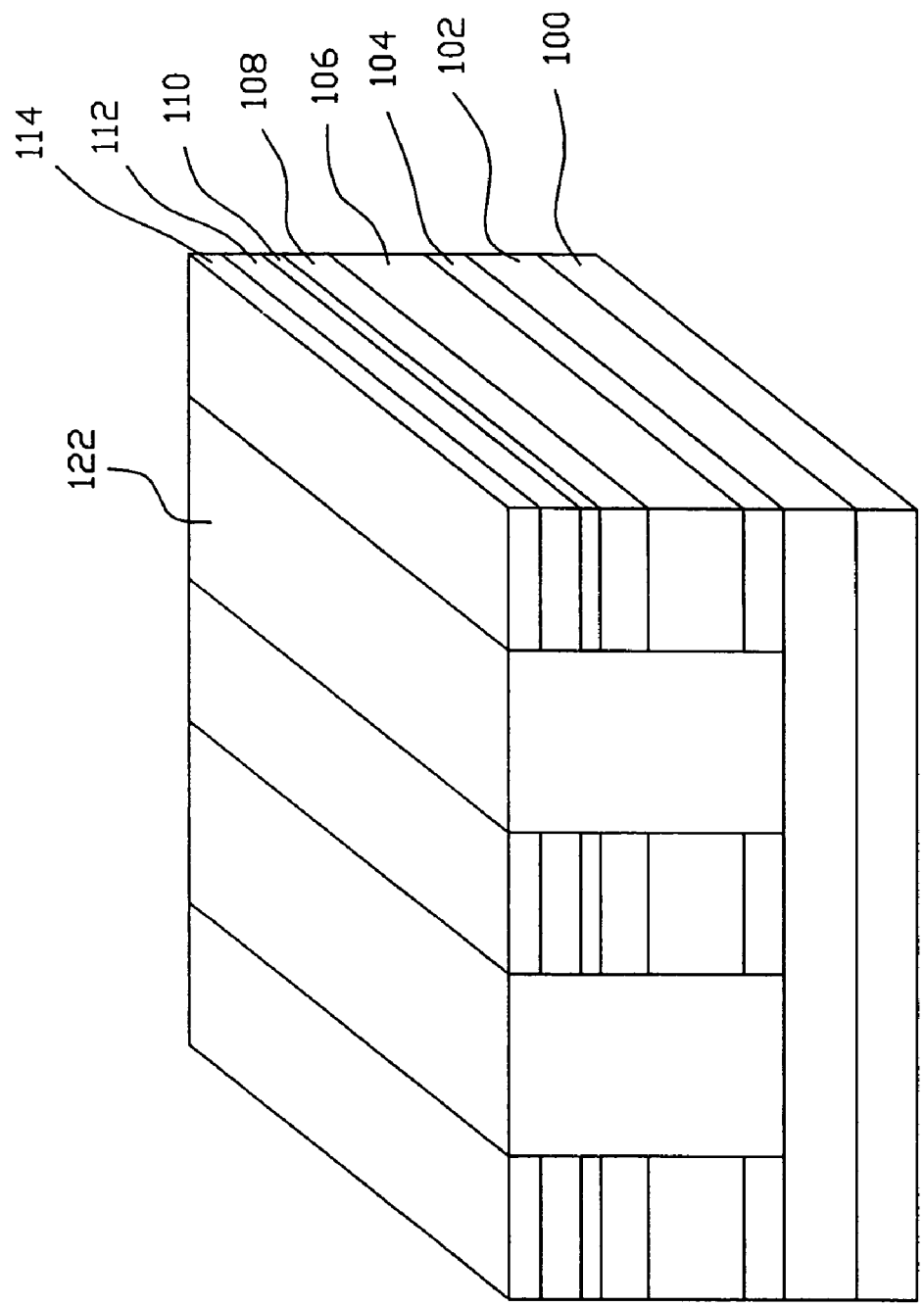
FIG. 12 shows the structure after an insulator is filled in the gaps formed in FIG. 11.

Referring to FIG. 10, a photoresist 116 is coated on the multilayer stack and then developed to form a pattern having trenches 118 between adjacent lines to define a plurality of bit lines by a mask. Then, as shown in FIG. 11, gaps 120 are etched by isotropic etch or reactive ion etch (RIE) process with the patterned photoresist 116 as a mask through the trenches 118 deep into the multilayer stack to reach the top surface of the oxide 102. As a result, the conductor 104 is patterned to form the bit lines and a plurality of stack lines each remained on a bit line. By using high density plasma (HDP) oxide and CMP process, the gaps 120 are filled with oxide 122 up to the top surface of the top layer 114 for isolation, as shown in FIG. 12 after removing the photoresist 116.

Figure 13:
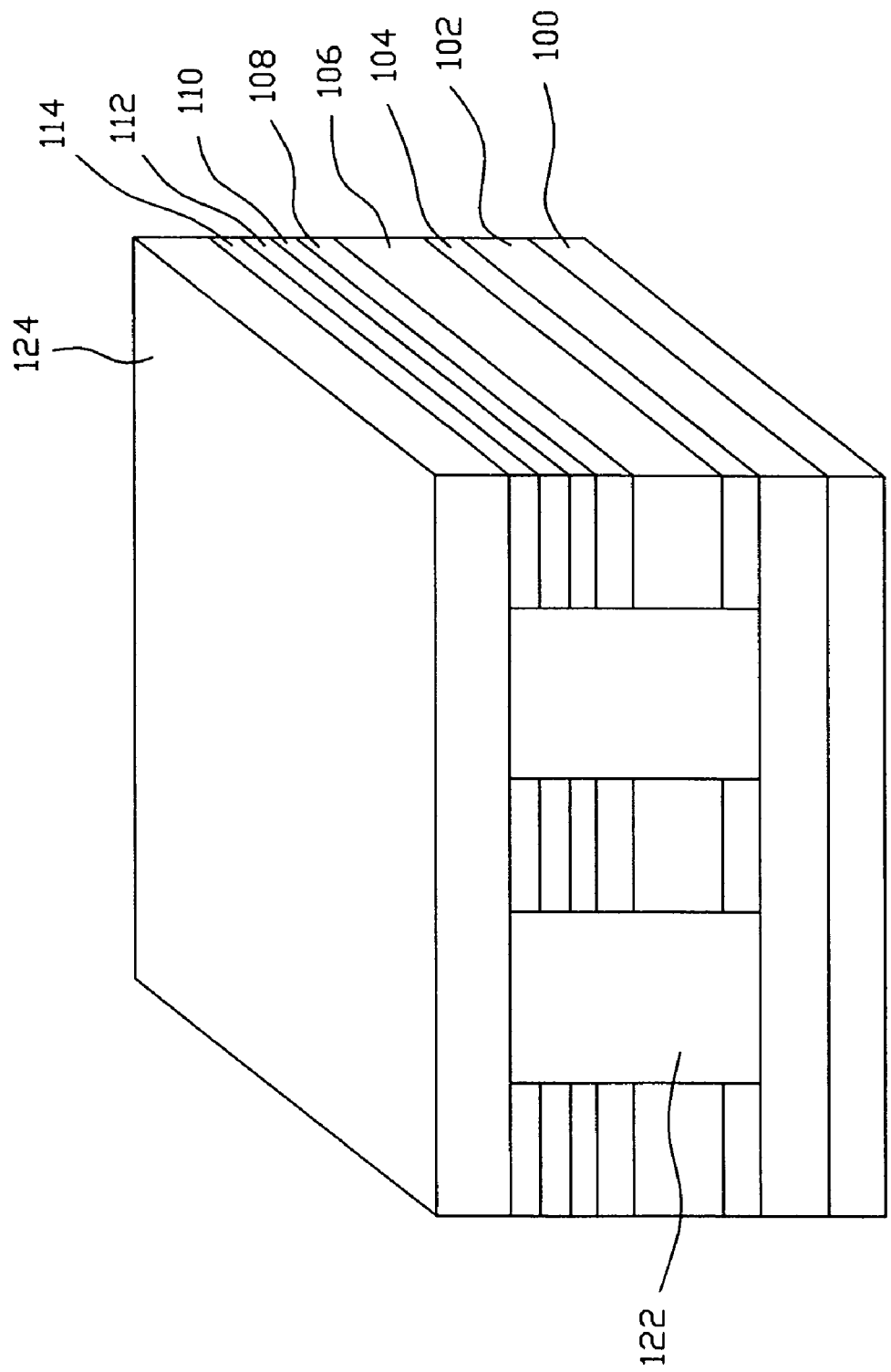
FIG. 13 shows the structure after a layer of conductor is deposited on the structure of FIG. 12.
Figure 14:
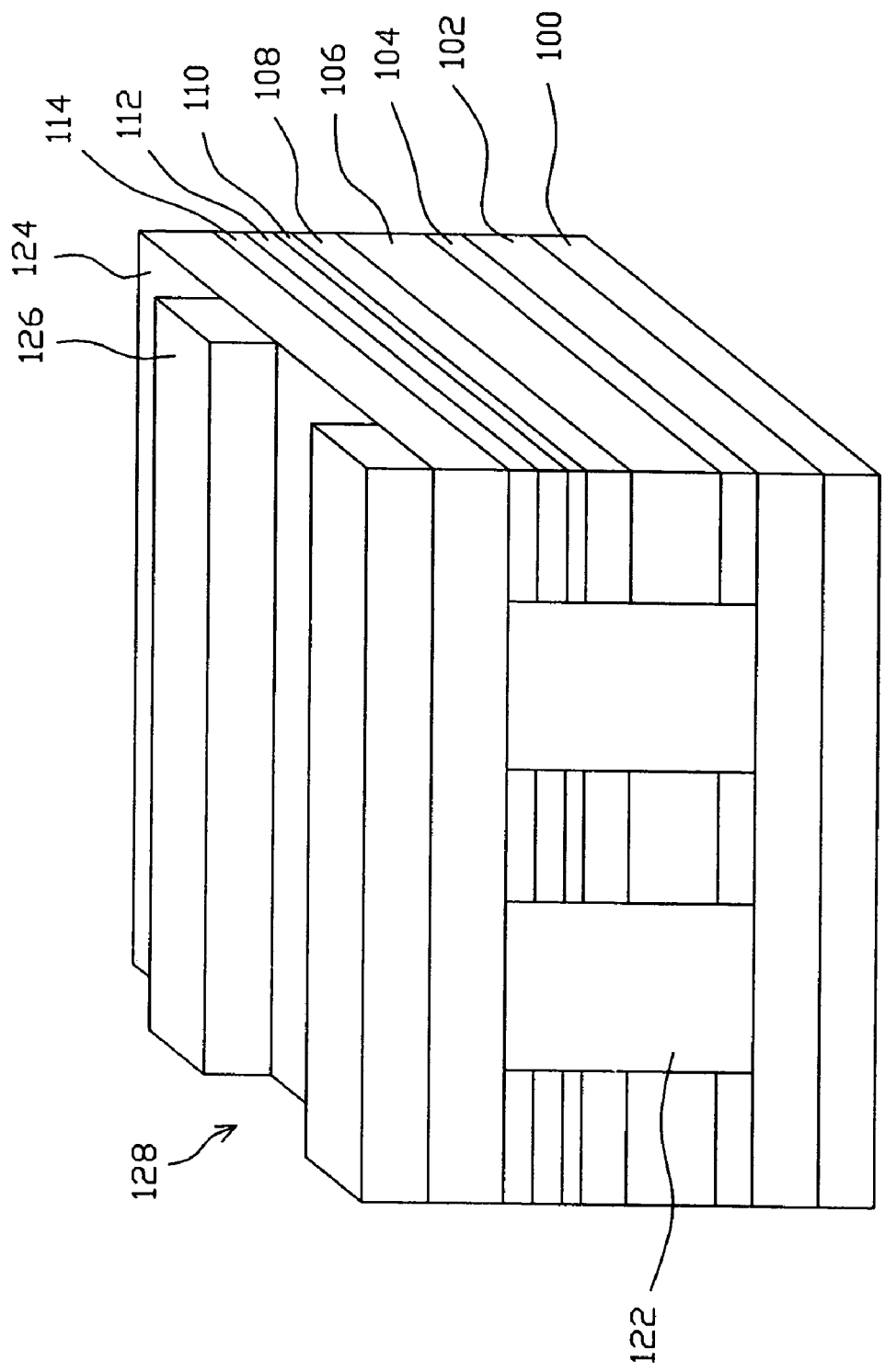
FIG. 14 shows the structure after a photoresist is developed to define word lines on the conductor formed in FIG. 13.
Figure 15:
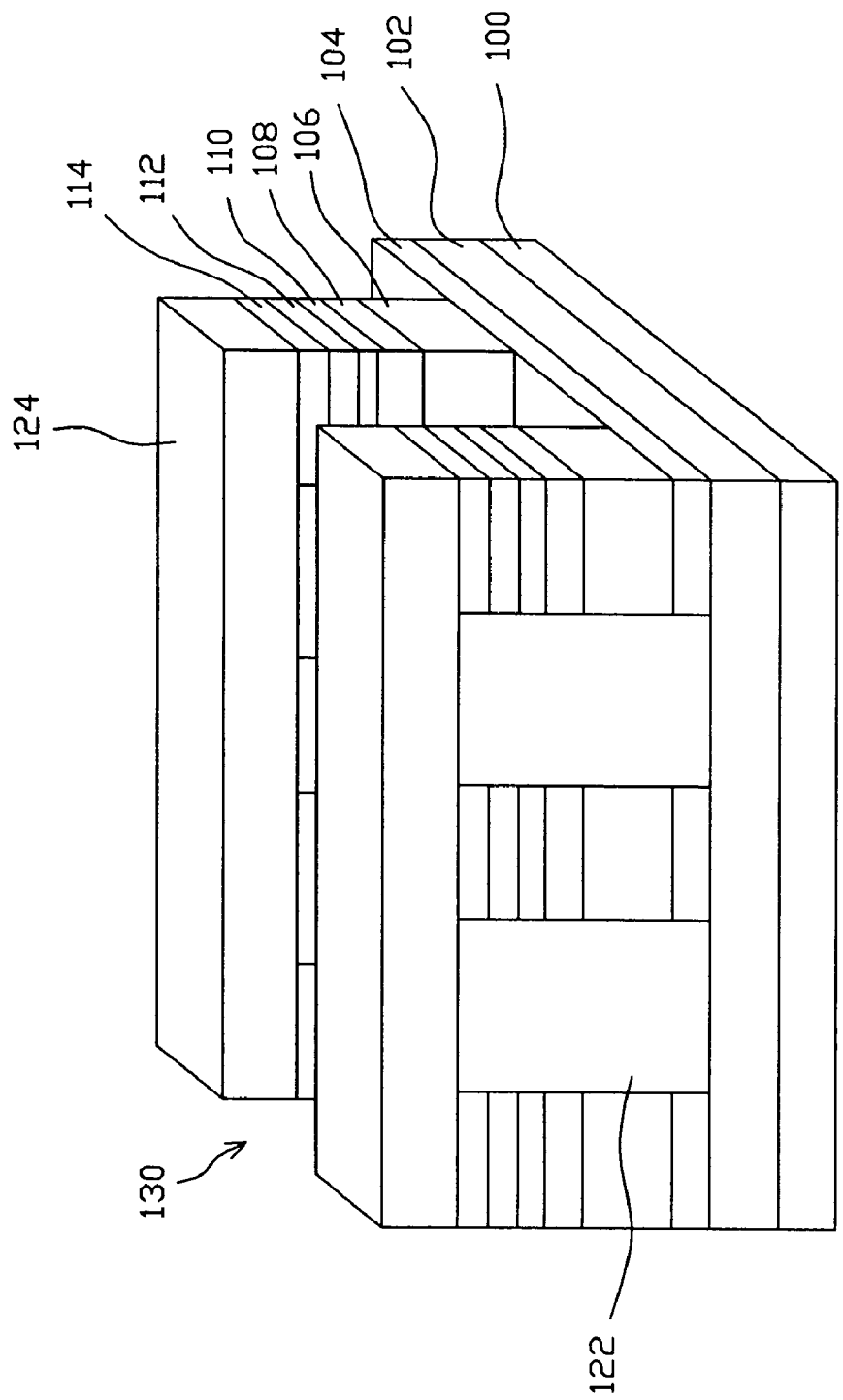
FIG. 15 shows the structure after gaps are etched in the resultant structure of FIG. 14.
Figure 16:
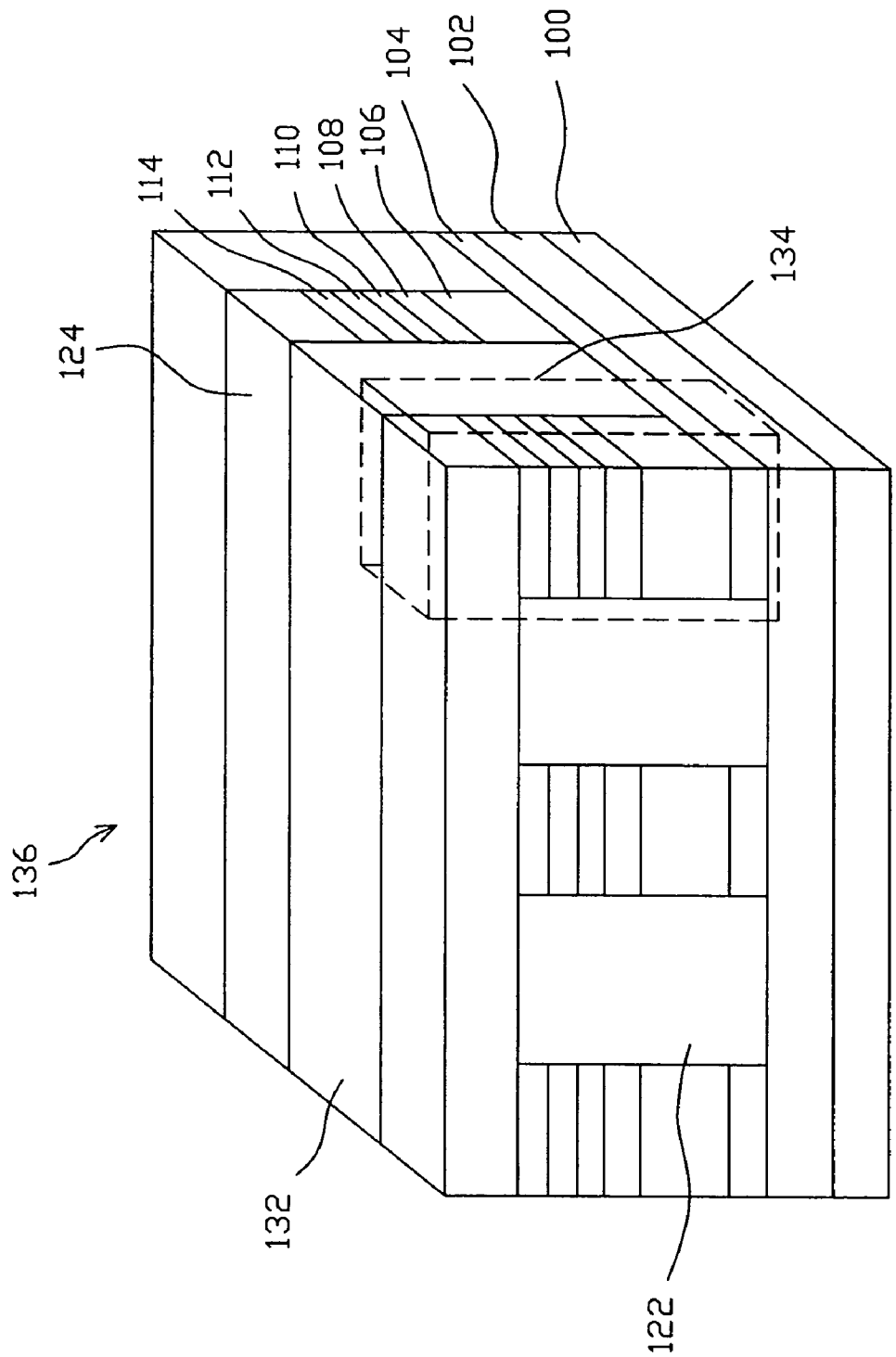
FIG. 16 shows the structure after an insulator is filled in the gaps formed in FIG. 15.

Another layer of conductor 124, for example the same material as the bit lines 104, is further deposited on the layer 114 and oxide 122, as shown in FIG. 13, and a photoresist 126 is coated on the conductor 124 and then patterned to form lines with trenches 128 therebetween to define word lines by a mask, as shown in FIG. 14. The conductor 124 and the underlying stack lines are etched with the photoresist 126 as a mask through the trenches 128 by for example isotropic etch or RIE process to stop on the top surface of the bit lines 104. The resultant structure is shown in FIG. 15. Again, an oxide 132 is used to fill in the gaps 130 to thereby complete the memory array 136, as shown in FIG. 16 after removing the photoresist 124. In this memory array 136, a plurality of memory cells with the structure as shown in the foregoing embodiments, such as the one 134, are disposed at respective intersections between the word lines 124 and bit lines 104.

Figure 17:
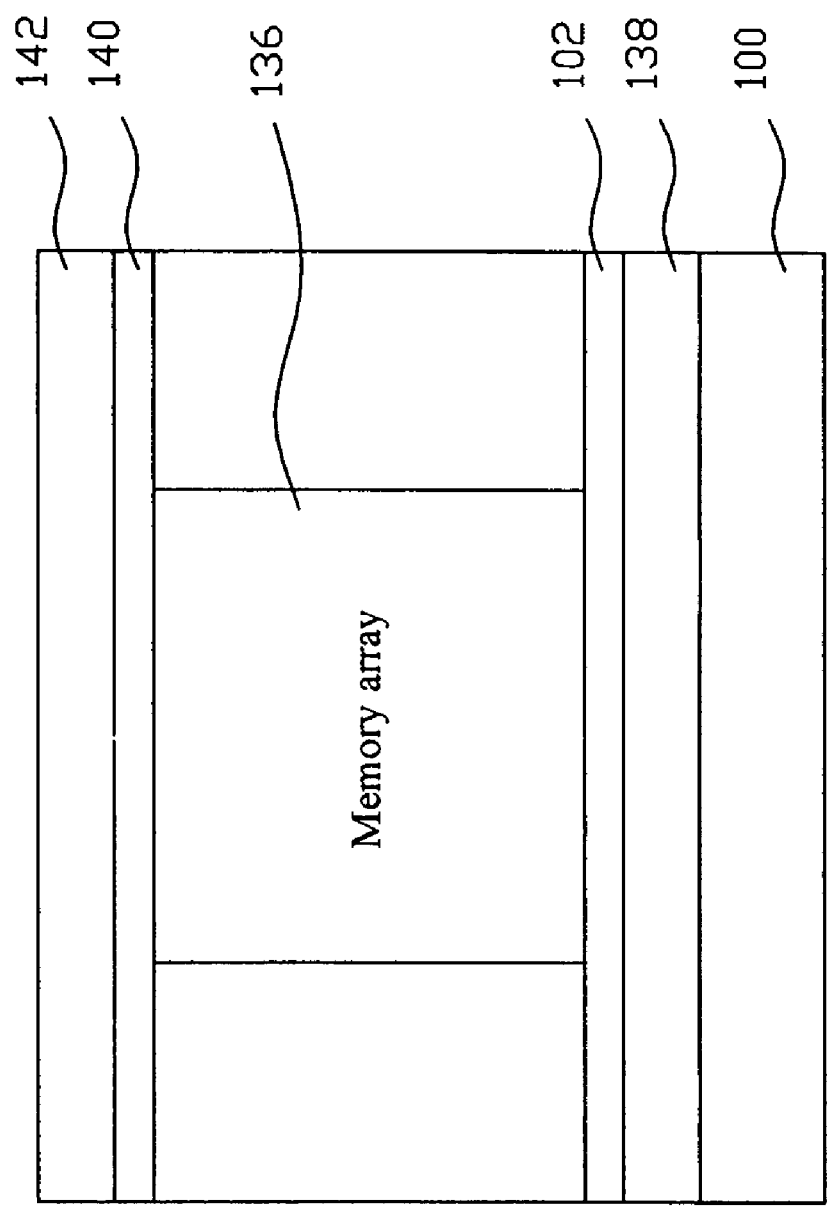
FIG. 17 is an illustrative diagram of an application of the invented memory array to be combined with other integrated circuits on a chip.

Apparently, the process to manufacture the memory array 136 is simple and quick. During the procedure, only two photo masks are needed, one to define the bit lines 104 and the other to define the word lines 124. Further, the resultant memory array 136 thus formed is most compact, since the memory cells have the structure to occupy minimum area on a chip by self-aligned to the bit lines 104 and word lines 124. In addition, the memory array 136 is flat and squared in a cube, which makes it easy to combined with other integrated circuits or integrated on a single chip. FIG. 17 is an example to show such advantages. As in the aforementioned descriptions, the memory array 136 is manufactured on a substrate 100 with an insulator 102 therebetween. The substrate 100 further includes an integrated circuit 138 under the insulator 102 before the memory array 136 is manufactured. Also, another integrated circuit 142 can be further manufactured over the memory array 136 with an insulator 140 therebetween. Thus, the memory array 136 can be embedded or integrated with other circuits in most compact manner.

Figure 18:
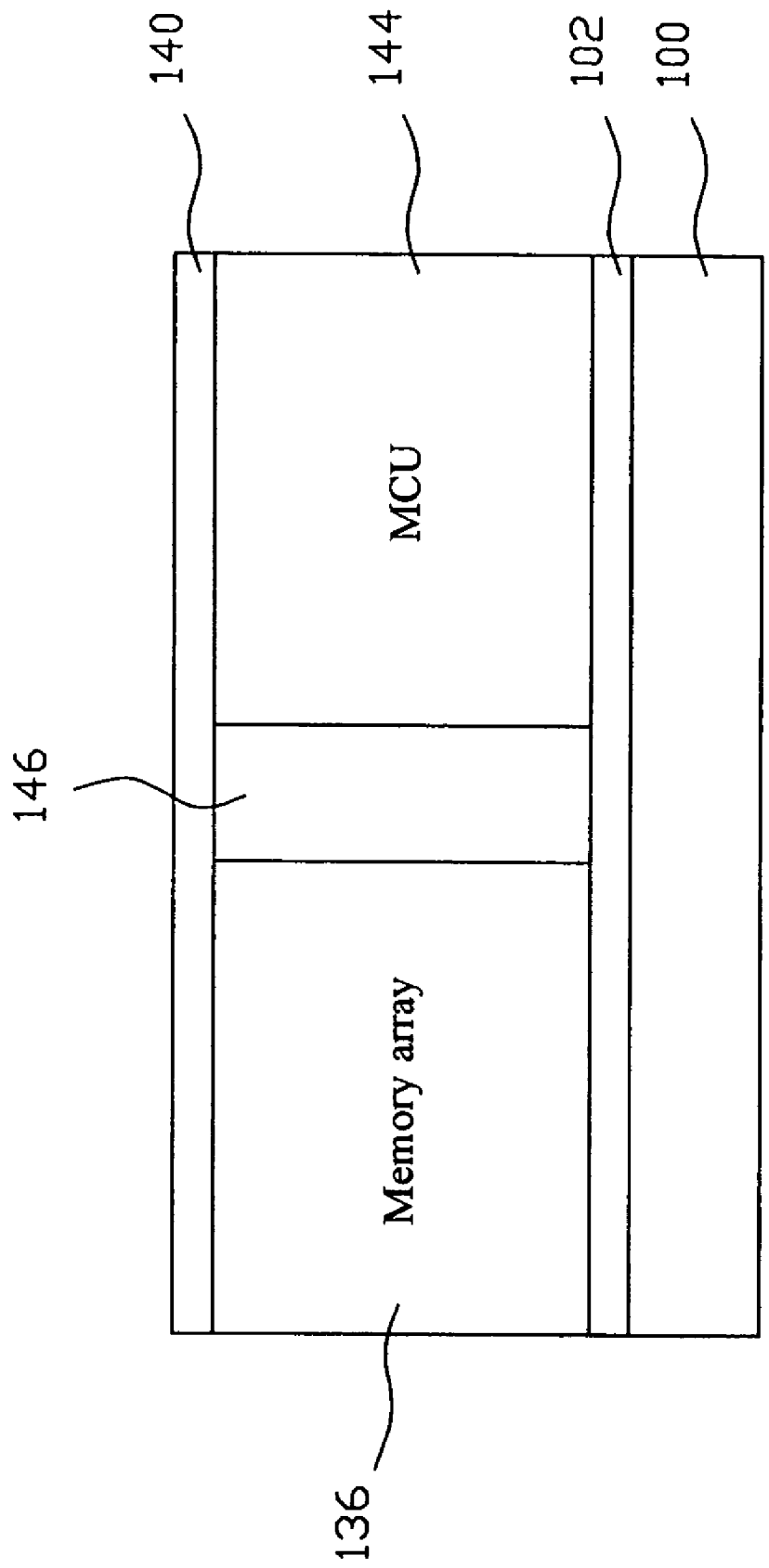
FIG. 18 is an illustrative diagram of an alternative application of the invented memory array to be combined with an MCU for a microchip.
Figure 19:
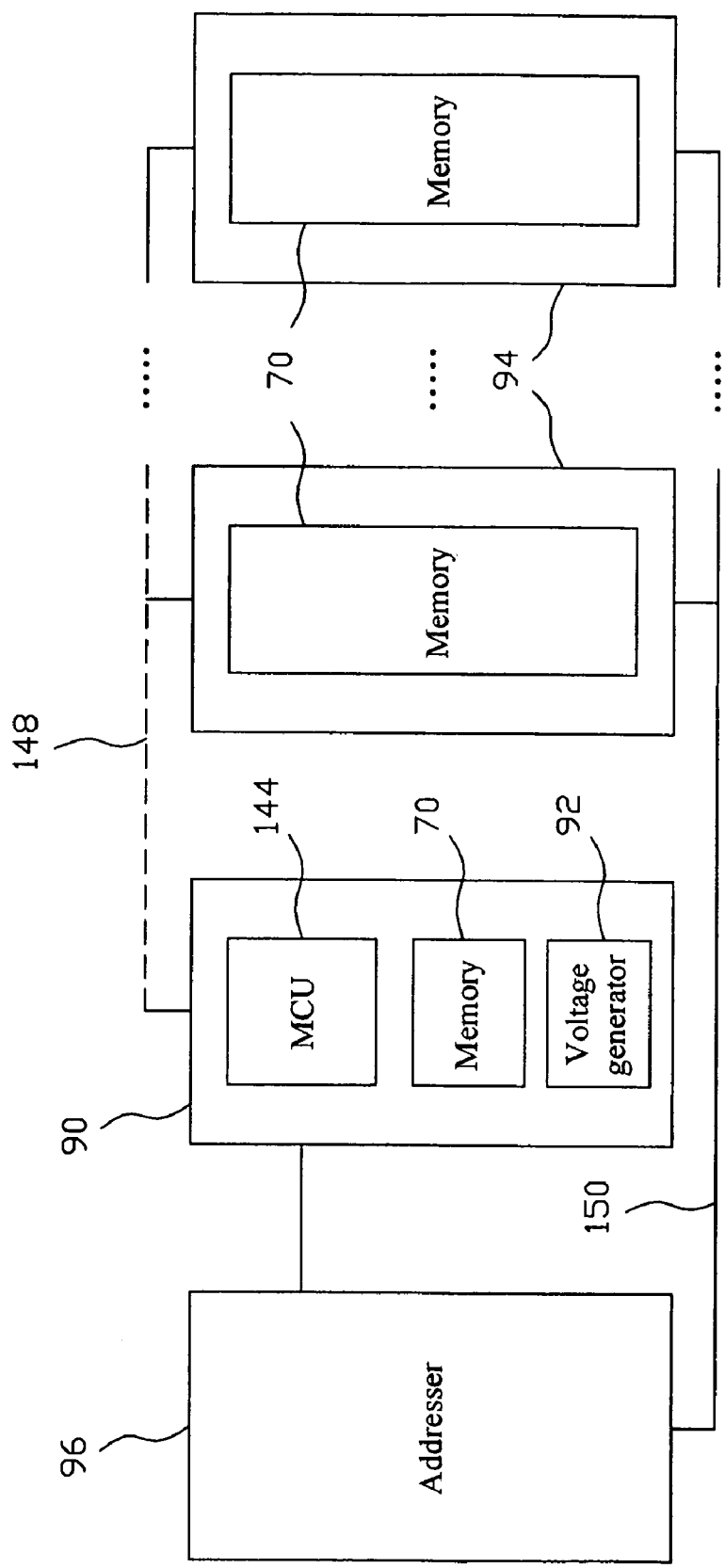
FIG. 19 is a block diagram of an application of the integrated circuit of FIG. 18 in a system.

FIG. 18 is a further application to combine the memory array 136 with a microcontroller unit (MCU) 144 for a microchip. Since the memory array 136 can be made in a compact cube, it can be arranged beside the MCU 144 with a side insulator 146 between them, which makes a microcontroller or microprocessor with embedded nonvolatile memory easily manufactured. An example is shown in FIG. 19, in which a microchip 90 includes an MCU 144, a nonvolatile memory 70 and a voltage generator 92 for programming the memory 70. To expand the memory capacity available for the system, the chip 90 can access a plurality of memory chips 94 by direct bus 148 connecting them together, or by interfaced addresser 96 through a bus 150 connecting to the memory chips 94. Each memory chip 94 has a very high capacity of memory, since the memory 70 is most compact and multilevel programmable. To program any one of the memory chips 94, the voltage generator 92 in the chip 90 is used to provide programming voltages, and thus the memory chips 94 are not necessarily prepared most of peripheral circuit. It is much advantages since the programming circuit for a one-time programmable memory will never be used after it is programmed.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A method for manufacturing a nonvolatile memory including a plurality of memory cells programmable by a heat induced chemical reaction, said method comprising the steps of: forming a multilayer stack on a surface of a substrate, said multilayer stack including a first conductor layer for formation of a plurality of bit lines, a layer or layers for formation of a plurality of selecting elements each for a respective one of said plurality of memory cells, a barrier layer, and at least two base materials for formation of a plurality of storage cells capable of being programmed by said heat induced chemical reaction; etching first gaps into said multilayer stack to reach said surface of a substrate in a first pattern to define said plurality of bit lines in a first direction and a plurality of remaining stack lines each on one of said plurality of bit lines; filling a first insulator in said first gaps; depositing a second conductor layer over said plurality of remaining stack lines and said first insulator for formation of a plurality of word lines; etching second gaps into said second conductor layer, said plurality of remaining stack lines, and said first insulator to reach a surface of said first conductor layer in a second pattern to define said plurality of word lines in a second direction to thereby form a plurality of intersections in an array between said plurality of word lines and bit lines with each of said plurality of memory cells thus formed at one of said plurality of intersections; and filling a second insulator in said second gaps to form a memory array including said plurality of memory cells.

2. A method according to claim 1, wherein said substrate includes a bottom insulator under said memory array.

3. A method according to claim 2, wherein said substrate further includes an integrated circuit under said bottom insulator.

4. A method according to claim 1, further comprising a formation of an integrated circuit above said memory array with a top insulator therebetween.

5. A method according to claim 1, further comprising a formation of an integrated circuit beside said memory array with a side insulator therebetween.

6. A method according to claim 1, wherein said layer or layers for formation of a plurality of selecting elements include two layers of semiconductor material to form a plurality of PN-diodes each for one of said plurality of selecting elements.

7. A method according to claim 1, wherein said layer or layers for formation of a plurality of selecting elements include a semiconductor material to form a plurality of Schottky junctions between said semiconductor material and first conductor layer.

8. A method according to claim 1, wherein said barrier layer includes a material capable of being electrically heated.

9. A method according to claim 1, wherein said barrier layer includes a material selected from a group composed of TiN, TiAlN and TaN.

10. A method according to claim 1, wherein said at least two base materials for formation of a plurality of storage cells include a silicon or polysilicon and a metal capable of thermally reacting with said silicon or polysilicon for a formation of at least one alloy layer.

11. A method according to claim 10, wherein said metal is selected from a group composed of Ni, Co, Ti, and W.

12. A method according to claim 1, wherein said at least two base materials include a Ga and an As.

* * * * *